(12) United States Patent
Ma et al.

(10) Patent No.: US 8,772,876 B2
(45) Date of Patent: Jul. 8, 2014

(54) HIGH-VOLTAGE SILICON-ON-INSULATOR TRANSISTORS AND METHODS OF MANUFACTURING THE SAME

(75) Inventors: William Hsioh-Lien Ma, Fishkill, NY (US); Jack Allan Mandelman, Flat Rock, NC (US); Carl John Radens, LaGrangeville, NY (US); William Robert Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1323 days.

(21) Appl. No.: 11/929,694

(22) Filed: Oct. 30, 2007

(65) Prior Publication Data
US 2008/0048263 A1   Feb. 28, 2008

Related U.S. Application Data

(62) Division of application No. 11/347,413, filed on Feb. 3, 2006, now Pat. No. 7,790,527.

(51) Int. Cl.
*H01L 23/62* (2006.01)

(52) U.S. Cl.
USPC ............... 257/355; 257/347; 257/E29.268

(58) Field of Classification Search
USPC ........... 134/105; 257/347, 349, 355, E29.268
See application file for complete search history.

(56) References Cited

U.S. PATENT DOCUMENTS

| | | | |
|---|---|---|---|
| 4,647,340 A | 3/1987 | Szluk et al. | |
| 5,140,392 A | 8/1992 | Ikemasu | |
| 5,268,319 A | 12/1993 | Harari | |
| 5,312,767 A | 5/1994 | Shimizu et al. | |
| 5,355,011 A | 10/1994 | Takata | |
| 5,374,836 A | 12/1994 | Vinal et al. | |
| 5,525,822 A | 6/1996 | Vinal | |
| 5,581,102 A | 12/1996 | Kusumoto | |
| 5,627,394 A | 5/1997 | Chang et al. | |
| 5,698,884 A | 12/1997 | Dennen | |
| 5,710,451 A * | 1/1998 | Merchant | 257/347 |
| 5,719,424 A | 2/1998 | Ahmad et al. | |
| 5,719,425 A | 2/1998 | Akram et al. | |
| 5,786,620 A | 7/1998 | Richards, Jr. et al. | |
| 5,793,058 A | 8/1998 | Han et al. | |
| 5,814,869 A | 9/1998 | Dennen | |
| 5,866,460 A | 2/1999 | Akram et al. | |
| 5,885,876 A | 3/1999 | Dennen | |
| 5,891,776 A | 4/1999 | Han et al. | |
| 5,932,913 A | 8/1999 | Hsu | |
| 5,998,274 A | 12/1999 | Akram et al. | |
| 6,004,836 A | 12/1999 | Chang et al. | |
| 6,091,111 A | 7/2000 | Demirlioglu et al. | |
| 6,147,379 A | 11/2000 | Hori et al. | |
| 6,232,163 B1 | 5/2001 | Voldman et al. | |
| 6,380,585 B1 | 4/2002 | Odanaka et al. | |

(Continued)

*Primary Examiner* — Laura Menz
*Assistant Examiner* — Candice Y Chan
(74) *Attorney, Agent, or Firm* — Dugan and Dugan, PC

(57) ABSTRACT

In a first aspect, a first method of manufacturing a high-voltage transistor is provided. The first method includes the steps of (1) providing a substrate including a bulk silicon layer that is below an insulator layer that is below a silicon-on-insulator (SOI) layer; and (2) forming one or more portions of a transistor node including a diffusion region of the transistor in the SOI layer. A portion of the transistor node is adapted to reduce a voltage greater than about 5 V within the transistor to a voltage less than about 3 V. Numerous other aspects are provided.

14 Claims, 11 Drawing Sheets

(56) References Cited

U.S. PATENT DOCUMENTS

| | | |
|---|---|---|
| 6,413,829 B1 | 7/2002 | Yu |
| 6,414,365 B1 | 7/2002 | Letavic et al. |
| 6,429,077 B1 | 8/2002 | Tung |
| 6,445,052 B1 | 9/2002 | Lin |
| 6,461,907 B2 | 10/2002 | Imai |
| 6,521,962 B2 | 2/2003 | Evans |
| 6,566,680 B1 | 5/2003 | Krivokapic |
| 6,599,782 B1 | 7/2003 | Kikuchi et al. |
| 6,797,549 B2 | 9/2004 | Hebert |
| 6,808,965 B1 | 10/2004 | Miyasaka et al. |
| 6,825,528 B2 | 11/2004 | Iwata et al. |
| 6,867,431 B2 | 3/2005 | Konuma et al. |
| 7,064,019 B2 | 6/2006 | Fried et al. |
| 7,164,167 B2 | 1/2007 | Iwata et al. |
| 7,393,768 B2 | 7/2008 | Degroote |
| 2001/0045601 A1 | 11/2001 | Maeda et al. |
| 2002/0009837 A1 | 1/2002 | Iwamatsu et al. |
| 2002/0025642 A1 | 2/2002 | Akram et al. |
| 2002/0027246 A1 | 3/2002 | Kunikiyo |
| 2002/0031909 A1 | 3/2002 | Cabral et al. |
| 2002/0036328 A1 | 3/2002 | Richards, Jr. et al. |
| 2003/0089932 A1 | 5/2003 | Iwata et al. |
| 2003/0141553 A1 | 7/2003 | Miura |
| 2003/0211663 A1 | 11/2003 | Min et al. |
| 2004/0121547 A1 | 6/2004 | Lee et al. |
| 2004/0140530 A1 | 7/2004 | Kalburge et al. |
| 2004/0222466 A1 | 11/2004 | Fried et al. |
| 2005/0136632 A1 | 6/2005 | Rotondaro et al. |
| 2005/0162943 A1 | 7/2005 | Koelling et al. |
| 2005/0205931 A1 | 9/2005 | Mouli |
| 2006/0043484 A1 | 3/2006 | Cabral et al. |
| 2006/0081930 A1 | 4/2006 | Maegawa et al. |
| 2006/0081941 A1 | 4/2006 | Iwata et al. |
| 2006/0125041 A1 | 6/2006 | Yang et al. |
| 2006/0197158 A1 | 9/2006 | Babcock et al. |
| 2006/0270126 A1 | 11/2006 | Iwamatsu et al. |
| 2007/0007578 A1 | 1/2007 | Li et al. |
| 2007/0018236 A1 | 1/2007 | Tsuchiaki |
| 2007/0023836 A1 | 2/2007 | Miura |
| 2007/0042572 A1 | 2/2007 | Bauer |
| 2007/0166926 A1 | 7/2007 | Ko et al. |
| 2008/0081436 A1 | 4/2008 | Maeda et al. |

* cited by examiner

HIGH-VOLTAGE SILICON-ON-INSULATOR TRANSISTORS AND METHODS OF MANUFACTURING THE SAME

The present application is a division of and claims priority to U.S. patent application Ser. No. 11/347,413, filed Feb. 3, 2006, the contents of which is hereby incorporated by reference herein in its entirety.

FIELD OF THE INVENTION

The present invention relates generally to semiconductor device manufacturing, and more particularly to high-voltage silicon-on-insulator (SOI) transistors and methods of manufacturing the same.

BACKGROUND

A conventional bulk silicon transistor may accommodate high voltages. More specifically, when a high voltage is applied across such a conventional bulk silicon transistor, the transistor may reduce the high voltage such that the transistor operates using a typical voltage range. However, conventional silicon-on-insulator (SOI) transistors typically cannot accommodate high voltages. Consequently, the many benefits of SOI transistors cannot be realized in high-voltage applications.

SUMMARY OF THE INVENTION

In a first aspect of the invention, a first method of manufacturing a high-voltage transistor is provided. The first method includes the steps of (1) providing a substrate including a bulk silicon layer that is below an insulator layer that is below a silicon-on-insulator (SOI) layer; and (2) forming one or more portions of a transistor node including a diffusion region of the transistor in the SOI layer. A portion of the transistor node is adapted to reduce a voltage greater than about 5 V within the transistor to a voltage less than about 3 V.

In a second aspect of the invention, a first apparatus is provided. The first apparatus is high-voltage transistor that includes (1) a gate channel formed in a silicon-on-insulator (SOI) layer of a substrate, wherein the substrate includes a bulk silicon layer that is below an insulator layer that is below the SOI layer; and (2) a transistor node coupled to the gate channel. The transistor node includes a diffusion region of the transistor, and a portion of the transistor node is formed in the SOI layer. Further, a portion of the transistor node is adapted to reduce a voltage greater than about 5 V within the transistor to a voltage less than about 3 V.

In a third aspect of the invention, a first system is provided. The first system is a substrate including (1) a bulk silicon layer that is below an insulator layer that is below a silicon-on-insulator (SOI) layer; and (2) a high-voltage transistor having (a) a gate channel formed in the SOI layer of the substrate; and (b) a transistor node coupled to the gate channel. The transistor node includes a diffusion region of the transistor, and a portion of the transistor node is formed in the SOI layer. Further, a portion of the transistor node is adapted to reduce a voltage greater than about 5 V within the transistor to a voltage less than about 3 V. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides high-voltage SOI transistors and methods of manufacturing the same. More specifically, the present invention provides a transistor including a layer of silicon on an insulating layer, such as buried oxide (BOX) layer. At least one region of the silicon layer may be adapted to reduce a high voltage (e.g., greater than or equal to about 5 V) sensed by the transistor so that the transistor may operate using a typical transistor voltage range (e.g., between about 1 and about 3 V). Such a region of the silicon layer may be a portion of a transistor diffusion region, which serves as or may be included in a high-voltage node of the transistor. In some embodiments, a voltage reduction provided by the high-voltage node may be based on one or more dimensions (e.g., a width) of a spacer included in the high-voltage node and/or a concentration (e.g., dopant concentration) of silicon in a region of the silicon layer adapted to reduce a high voltage. Further, in some embodiments, the voltage reduction provided by the high-voltage node may be based on a thickness of the region of the silicon layer adapted to reduce a high voltage. Alternatively, in some other embodiments, a layer of epitaxial silicon may be formed on the at least one region of the silicon layer. In such embodiments, a voltage reduction provided by the high-voltage node may also be based on a concentration (e.g., dopant concentration) of silicon in the layer of epitaxial silicon.

In this manner, the present invention provides high-voltage SOI transistors and methods of manufacturing the same. Such a high-voltage SOI transistor may include a high-voltage node including a region adapted to reduce a voltage sensed by the transistor (e.g., cause an IR drop) such that the transistor may operate using voltages in a typical transistor voltage range.

Figure 1:
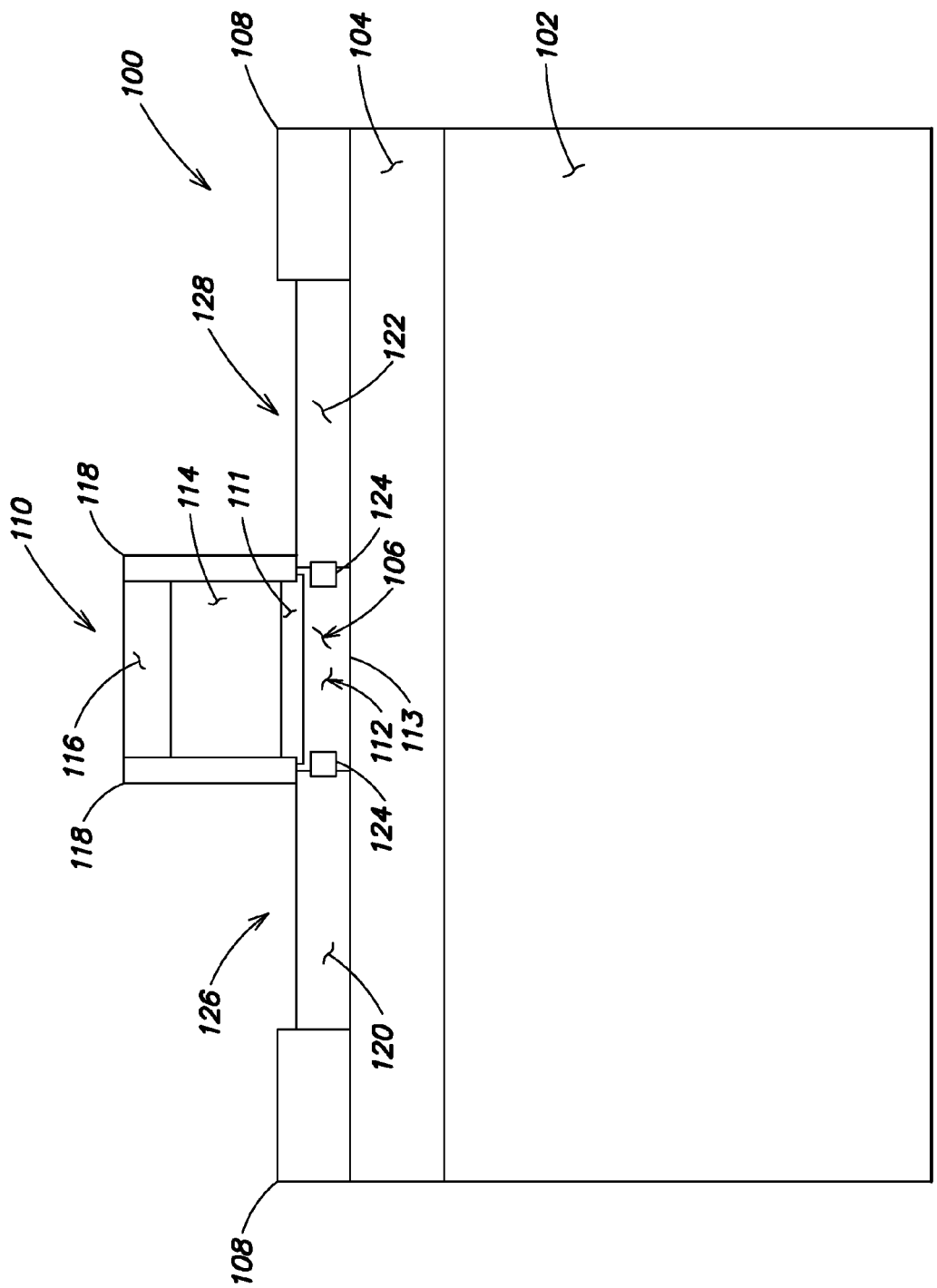
FIG. 1 is a cross-sectional side view of a substrate following a first step of a method of manufacturing a first exemplary high-voltage transistor in accordance with an embodiment of the present invention.

FIG. 1 is a cross-sectional side view of a substrate 100 following a first step of a method of manufacturing a first exemplary high-voltage transistor in accordance with an embodiment of the present invention. With reference to FIG. 1, a substrate 100 may be provided. The substrate 100 may include a bulk silicon layer 102 below an insulating layer, such as a buried oxide (BOX) layer 104. The BOX layer 104 may be below a layer of silicon (e.g., silicon-on-insulator (SOI) layer) 106. The layer of silicon 106 may include single crystal silicon (although the silicon layer 106 may include a different type of silicon). In some embodiments, the layer of silicon 106 may have a concentration of p-type dopant of about $1 \times 10^{15}$ cm$^{-3}$ to about $1 \times 10^{17}$ cm$^{-3}$ (although a larger or smaller and/or different concentration may be employed). As an example, reactive ion etching (RIE) followed by chemical vapor deposition (CVD) and chemical mechanical polishing (CMP) may be employed to form STI oxide regions 108 on the substrate 100. However, the STI oxide regions 108 may be formed in a different manner.

Further, a gate stack 110 may be formed on the substrate 100. For example, CVD or another suitable method followed by RIE or another suitable method may be employed to form a gate oxide layer 111 over a portion 112 of the SOI layer 106 on the substrate 100. Such a portion 112 of the SOI layer 106 may serve as a gate channel 113. The gate oxide layer 111 may serve as a gate dielectric. A gate conductor layer 114 may be formed on the gate dielectric layer 111, and a gate-capping oxide layer 116 may be formed on the gate conductor layer 114 in a similar manner.

CVD or another suitable method may be employed to form a conformal insulating layer on the substrate 100. Thereafter, RIE or another suitable method may be employed to remove portions of the insulating layer. In this manner, one or more insulating spacers 118 may be formed adjacent sidewalls of the gate dielectric layer 111, gate conductor layer 114 and/or gate-capping oxide layer 116 on the substrate 100. Each insulating spacer 118 may have a width of about 5 nm to about 60 nm (although a larger or smaller and/or different width range may be employed).

Angled ion/implantation (I/I) or another suitable method may be employed to implant extensions into silicon in a plurality of regions (e.g., first and second regions 120, 122) of the SOI layer 106. The extensions may reduce respective resistance of such regions 120, 122. Similarly, halos 124 may be implanted into the SOI layer 106. The halos 124 may affect a threshold voltage of the high-voltage transistor being manufactured. The first and second regions 120, 122 of the SOI layer 106 may serve as respective diffusion regions of the transistor being manufactured.

The substrate 100 in this state may serve as the base device for the first through third exemplary high-voltage transistors described below. For example, such a base device may be employed to form a high-voltage n-channel MOSFET (NMOS) and/or a high-voltage p-channel MOSFET (PMOS). A first portion or node of the substrate 100 may serve as a high-voltage node 126 and a second portion or node of the substrate 100 may serve as a low-voltage node 128.

Figure 2:
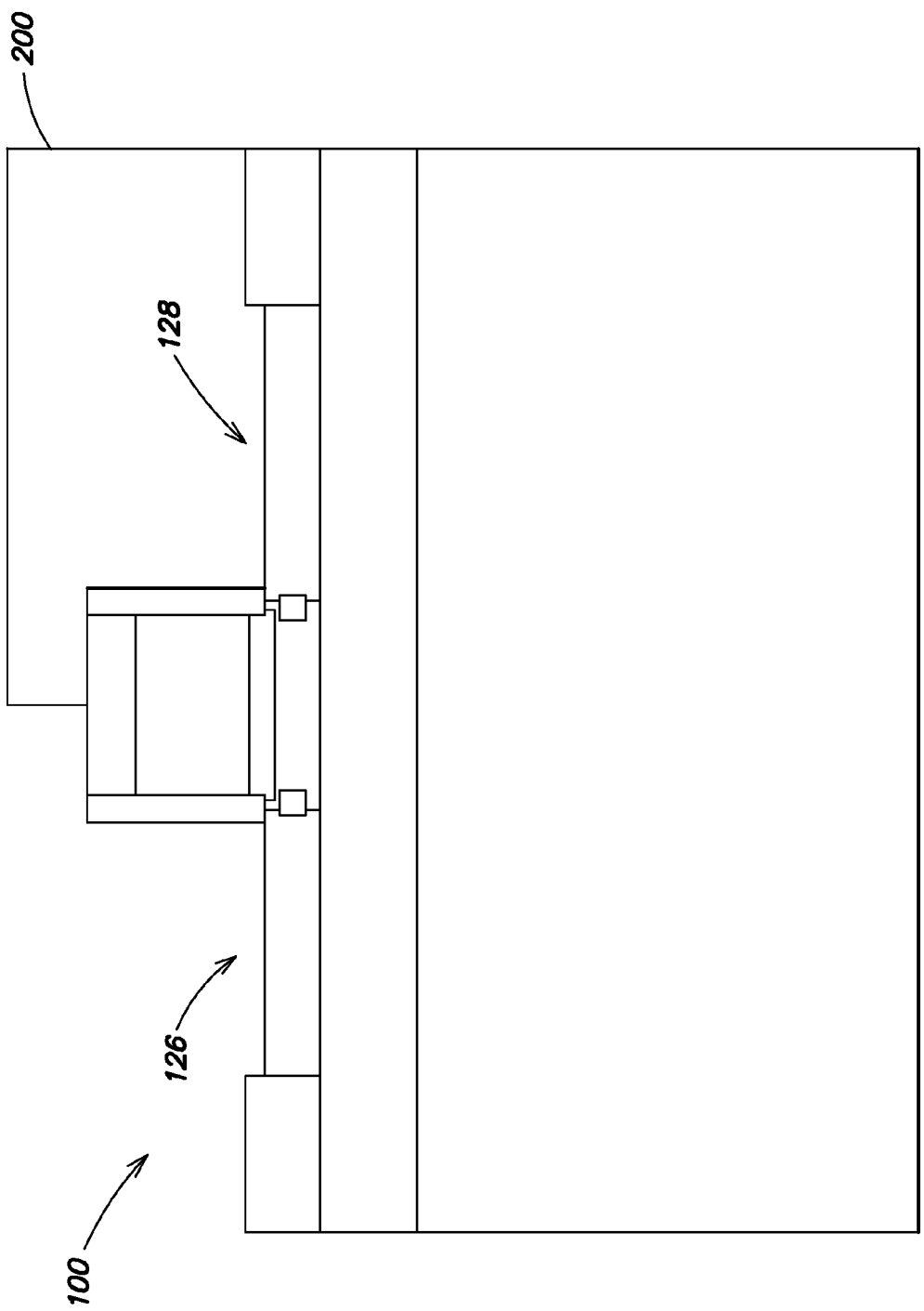
FIG. 2 is a cross-sectional side view of the substrate following a second step of the method of manufacturing the first exemplary high-voltage transistor in accordance with an embodiment of the present invention.

FIG. 2 is a cross-sectional side view of the substrate 100 following a second step of the method of manufacturing the first exemplary high-voltage transistor in accordance with an embodiment of the present invention. With reference to FIG. 2, a spin-on technique or another suitable method may be employed to deposit a photoresist layer on the substrate 100. The photoresist layer may be patterned with a mask such that portions of the photoresist layer may be removed during a subsequent process (e.g., developing) as is known to those skilled in the art. In this manner, a mask 200 may be formed on a low-voltage node 128 of the substrate 100. Alternatively, rather than the photoresist layer, a layer of hard mask material such as polysilicon, silicon nitride (SiN) or the like, may be deposited, and thereafter, selectively etched to yield mask 200. Consequently, the high-voltage node 126 may remain exposed (e.g., is not covered by the mask 200).

Figure 3:
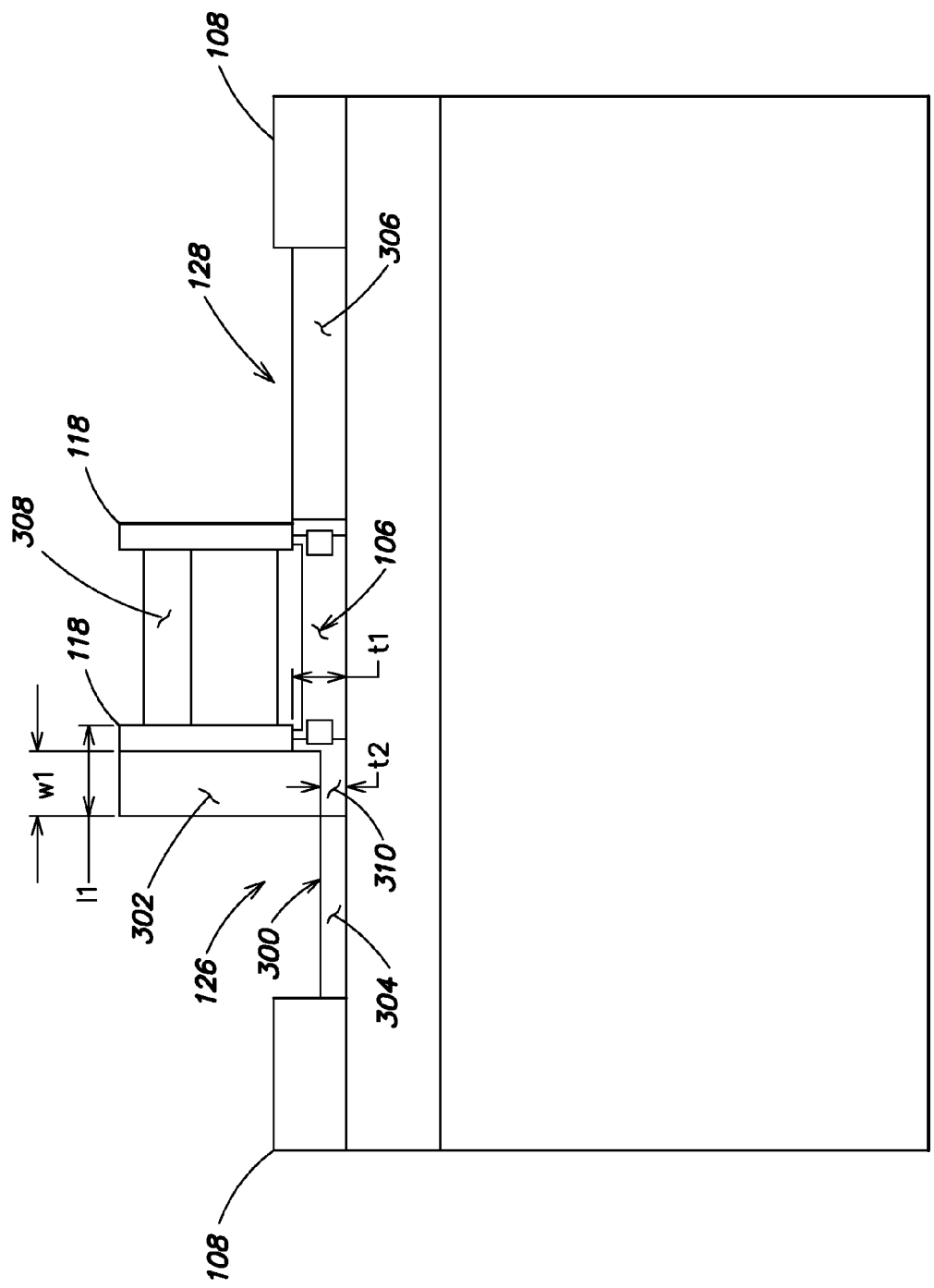
FIG. 3 is a cross-sectional side view of the substrate following a third step of the method of manufacturing the first exemplary high-voltage transistor in accordance with an embodiment of the present invention.

FIG. 3 is a cross-sectional side view of the substrate following a third step of the method of manufacturing the first exemplary high-voltage transistor in accordance with an embodiment of the present invention. With reference to FIG. 3, RIE or another suitable method may be employed to remove silicon from one of the diffusion regions 120, 122 (e.g., the first region 120). Therefore, silicon (e.g., active silicon) in the SOI layer 106 may selectively thinned (e.g., in one of the diffusion regions 120, 122). During RIE, the mask (200 in FIG. 2) may prevent silicon from the second region 122 from being removed. In this manner, silicon in the first region 120 may be thinned from a thickness t1 of about 40 nm to about 110 nm to thickness t2 of about 10 nm to about 80 nm (although a larger or smaller and/or different range may be employed for t1 and/or t2). The thickness of such a thinned region 300 may determine a resistance thereof and determine a voltage drop provided thereby. Exemplary voltage drop data is described below with reference to FIG. 5.

CVD or another suitable method may be employed to form a conformal insulating layer (e.g., a nitride layer, oxide layer and/or the like) on the substrate 100. Thereafter, RIE or another suitable method may be employed to remove portions of the insulating layer. In this manner, a spacer 302 (e.g., a wide spacer) may be formed adjacent a sidewall of spacer 118 on a portion of the thinned region 300 in the high-voltage node 126. The spacer 302 may have a width w1 of about 80 nm to about 200 nm (although a larger or smaller and/or different spacer width range may be employed). In some embodiments, such process steps may also be performed on other portions of the substrate 100, such as the STI oxide region 108 in the low-voltage node 128 (assuming such portion of the substrate 100 is exposed for processing) to form a spacer thereon. In this manner, a spacer width differential may be established between the high and low-voltage nodes 126, 128. More specifically, a combined width of spacer 118 and spacer 302 may prevent a larger portion of the thinned region 300 from being exposed during subsequent processing than the portion of the second region 122 protected by the spacer 118 in the low-voltage node 128.

RIE or another suitable method may be employed to remove the mask (200 in FIG. 2) from the substrate 100. Similarly, the gate-capping layer (116 in FIG. 1) may be removed from the substrate 100. High-dose implantation may be employed to form low contact resistance regions 304-308 on exposed portions of the substrate 100. For example, a concentration of $1 \times 10^{19}$ cm$^{-3}$ to about $1 \times 10^{20}$ cm$^{-3}$ of dopant may be implanted into the substrate 100 to form the contact regions 304-308. A portion 310 of the thinned region 300 protected from high-dose implantation by the spacers 302, 118 may be adapted to reduce a voltage therein (e.g., within the transistor), and therefore, may serve as an IR drop region. The length l1 of the IR drop region 310 may be based on the width w1 of the spacer 302 (along with a width of spacer 118). After high-dose implantation, the doping concentration of the IR drop region 310 compared to the contact region 304 is such that the resistance provided by the IR drop region 310 is greater than that provided by the contact region 304. Consequently, the voltage reduction provided by the IR drop region 310 may be based on a thickness t2, a length l1 and a doping concentration of such region 310, which affects the resistivity thereof. In this manner, the voltage reduction provided by the IR drop region 310 may be controlled laterally by the spacer 302 (e.g., a width w1 of the spacer 302) and controlled vertically by RIE employed to thin the first region 120.

Figure 4:
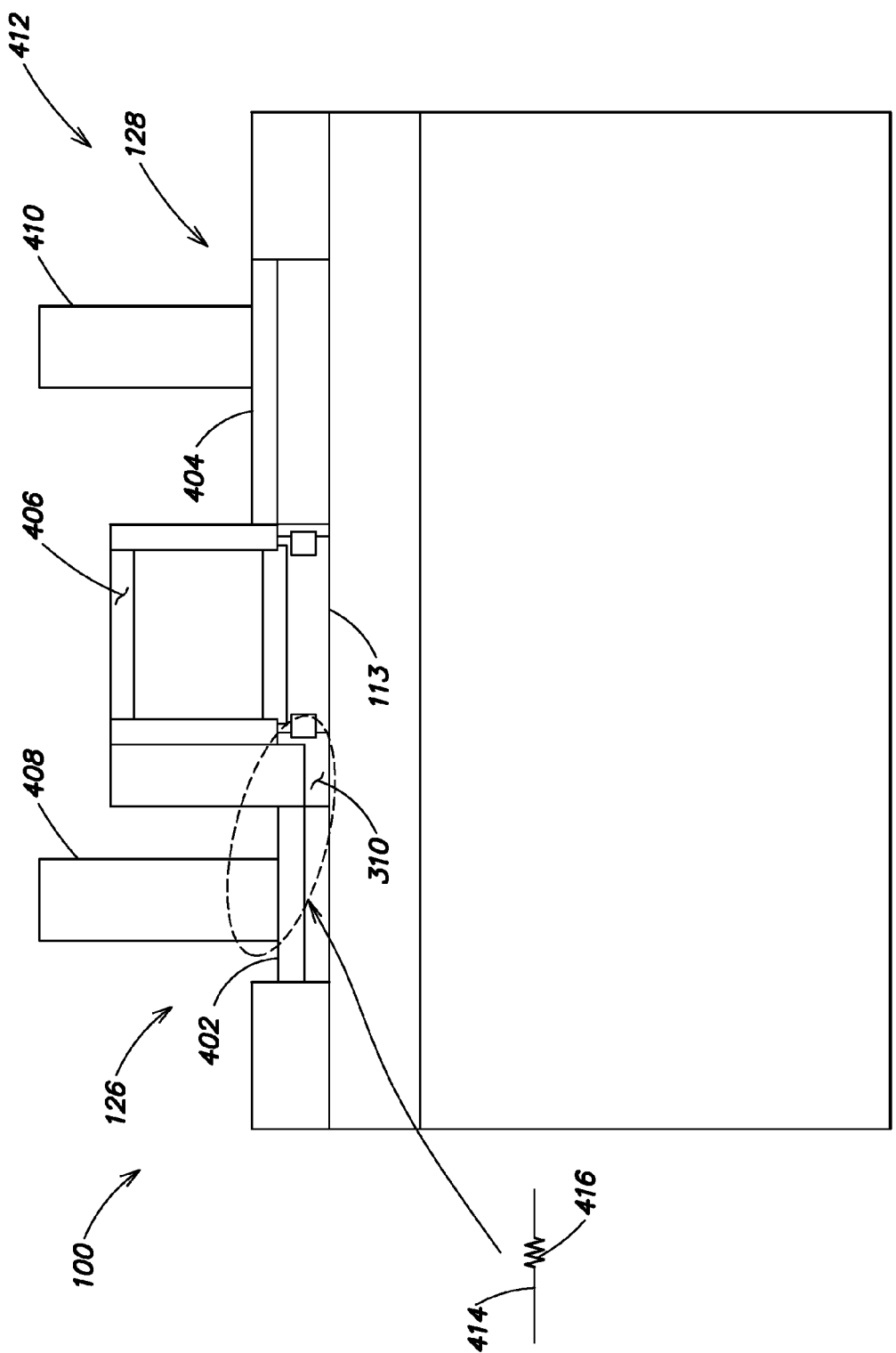
FIG. 4 is a cross-sectional side view of the substrate following a fourth step of the method of manufacturing the first exemplary high-voltage transistor in accordance with an embodiment of the present invention.

FIG. 4 is a cross-sectional side view of the substrate following a fourth step of the method of manufacturing the first exemplary high-voltage transistor in accordance with an embodiment of the present invention. With reference to FIG. 4, CVD or another suitable method may be employed to deposit a layer of metal on the substrate 100. Thereafter, silicidation may be employed to cause the metal to react with material coupled thereto (e.g., silicon, gate conductor and/or the like) such that silicide regions 402-406 are formed on the substrate 100. However, the silicide regions 402-406 may be formed in a different manner. Thereafter, CVD or another suitable method followed by RIE or another suitable method may be employed to form interconnects on the substrate 100. For example, interconnects 408, 410 may be formed in the high and low-voltage nodes 126, 128, respectively. In this manner, a first exemplary high-voltage transistor (e.g., NMOS or PMOS) 412 may be manufactured. In some embodiments, the transistor 412 may be an SOI n-channel laterally diffused MOSFET (S-NLDMOS) (although the transistor 412 may have a different configuration). The high-voltage node 126 may serve as drain and the low-voltage node 128 may serve as a source of the transistor 412, or vice versa.

In operation, the high-voltage node 126 of the transistor 412 may detect or sense a high voltage and reduce such high voltage to a voltage typically employed by transistors for internal operation. A high voltage may be between about 5 V to about 50 V, preferably about 10 V to about 50 V, and a voltage typically employed by transistors for internal operation is about 1 V to about 3 V. However, a larger or smaller and/or different range may be employed for the high voltage and/or for internal transistor operation. More specifically, the IR drop region 310 may be adapted (e.g., via dimensions and doping thereof) to reduce the high voltage to a voltage suitable to internal operation of the transistor 412. The low-voltage node 128 may be of a low resistance such that the low-voltage node 128 may provide little or no voltage drop.

The interconnect 120 may function as a short circuit and the IR drop region 310 may function as a high-resistance element. Therefore, the interconnect 120 and the IR drop region 310 coupled thereto of the high-voltage node 126 may schematically be represented as a wire 414 coupled to a resistor 416, respectively, which are coupled to the gate channel 113.

Through use of the method described above with reference to FIGS. 1-4, a transistor 412 having one or more components formed in an SOI layer 106 of a substrate 100 may be formed. For example, the transistor 412 may include a high-voltage node 126 having a diffusion region 120 formed in the SOI layer 106. The diffusion region 120 includes a laterally-controlled IR drop region 310 adapted to reduce therein a high voltage (e.g., greater than about 5 V) to a typical voltage for internal transistor operation (e.g., less than about 3 V). Further, the transistor 412 include a low-voltage node 128 adapted to provide little or no voltage drop therein.

Figure 5:
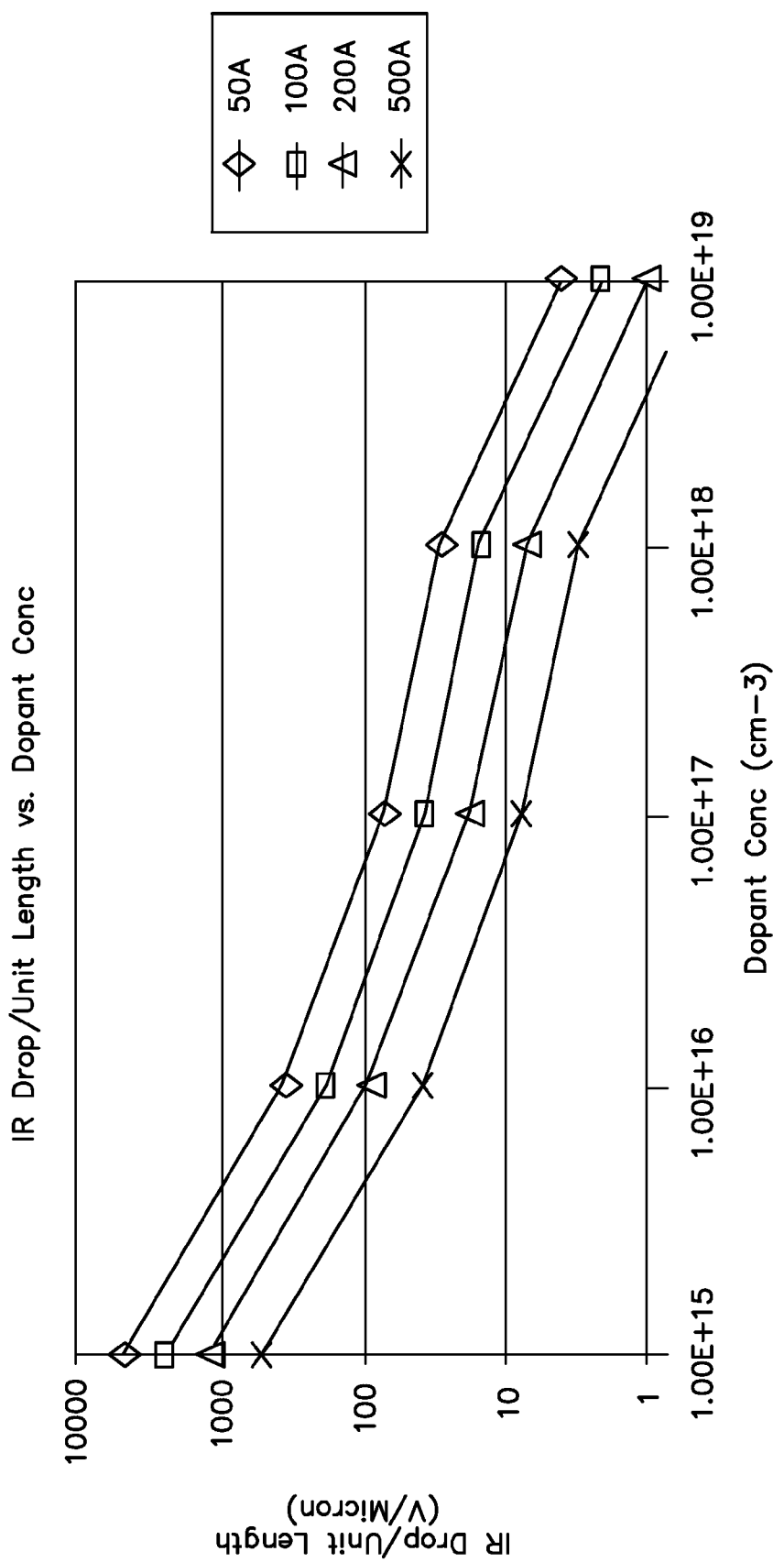
FIG. 5 is a graph 500 illustrating a relationship between IR drop/unit length and dopant concentration for various silicon thicknesses that may be included in the high-voltage transistor of FIG. 4 in accordance with an embodiment of the present invention.

FIG. 5 is a graph 500 illustrating a relationship between IR drop/unit length and dopant concentration for various silicon thicknesses that may be included in the high-voltage transistor of FIG. 4 in accordance with an embodiment of the present invention. With reference to FIG. 5, a first through fourth set 502-508 of data points in the graph 500 illustrates the relationship between IR drop/unit length and dopant concentration as a function of thickness (e.g., for an IR drop region 310 having a thickness of 50, 100, 200 and 500 Å, respectively). The graph 500 illustrates such a relationship for a concentration range between $1 \times 10^{15}$ cm$^{-3}$ and $1 \times 10^{19}$ cm$^{-3}$. IR drop region thickness may determine a resistance of such region. Therefore, by changing silicon IR drop region thickness, an order of magnitude of the resistance of such region may be changed.

The following assumptions were made when simulating or gathering the data 502-508 of the graph 500. However, data may be simulated or gathered using different assumptions. A drive current of the S-NLDMOS transistor 412 is targeted to be about 400 µA/µm. Consequently, a current of $400 \times 10^{-6}$ A/µm of width may pass between the source and drain of the S-NLDMOS. Further, low voltage operation (e.g., internal operation) of the transistor 412 is about 1 V.

Additionally, a width (e.g., into and out of the page) of the transistor 412 may be about 1 µm. Because a 1 µm width is employed, it may be simple to scale transistor design using the gathered or simulated data. Additionally, the length of the IR Drop region 310 is 1 µm. This distance may be defined by the width w1 of spacer 302. By using such a width w1, the transistor design may be scaled easily using a simple multiplier.

As shown, the transistor 412 may include an IR drop region 310 in the high-voltage node 126 having a high dopant concentration, such as greater than about $1 \times 10^{19}$ cm$^{-3}$. Such a concentration may still provide a significant voltage drop. However, the transistor 412 may include a low-voltage node 128 providing a very low IR drop. Therefore, overall transistor performance may not be adversely affected.

Assuming the high-voltage node 126 is adapted to detect 30 V, and therefore, cause an IR drop of 29 V which results in a 1 V transistor internal operation. The high voltage node resistance may be about 72.5 KΩ. As shown in the graph 500 such an IR drop can be obtained using one of a plurality of doping concentrations for any of the silicon thicknesses. The above values assume the high-voltage node 126 includes a 1 µm wide spacer. If a width w1 of such spacer is reduced to about 0.25 µm, then the voltage drop as shown in the graph 500 would reduce by a factor of 4. Thus, a combination of thickness and dopant concentration illustrated in the graph 500 that provides an IR drop/unit length of 116 V should be selected for such transistor design. As shown in the graph 500, a solution exists for many combinations of doping concentrations and silicon thicknesses. Thus, a transistor design point solution may be selected based on device requirements.

The present invention provides a second exemplary high-voltage transistor (800 in FIG. 8) and method of manufacturing the same. The method of manufacturing the second exemplary high-voltage transistor may include steps of the method of manufacturing the first exemplary method described with reference to FIGS. 1 and 2. For convenience, when appropriate, reference numerals of components in the first exemplary high-voltage transistor 412 are employed for corresponding components in the second exemplary high-voltage transistor.

Figure 6:
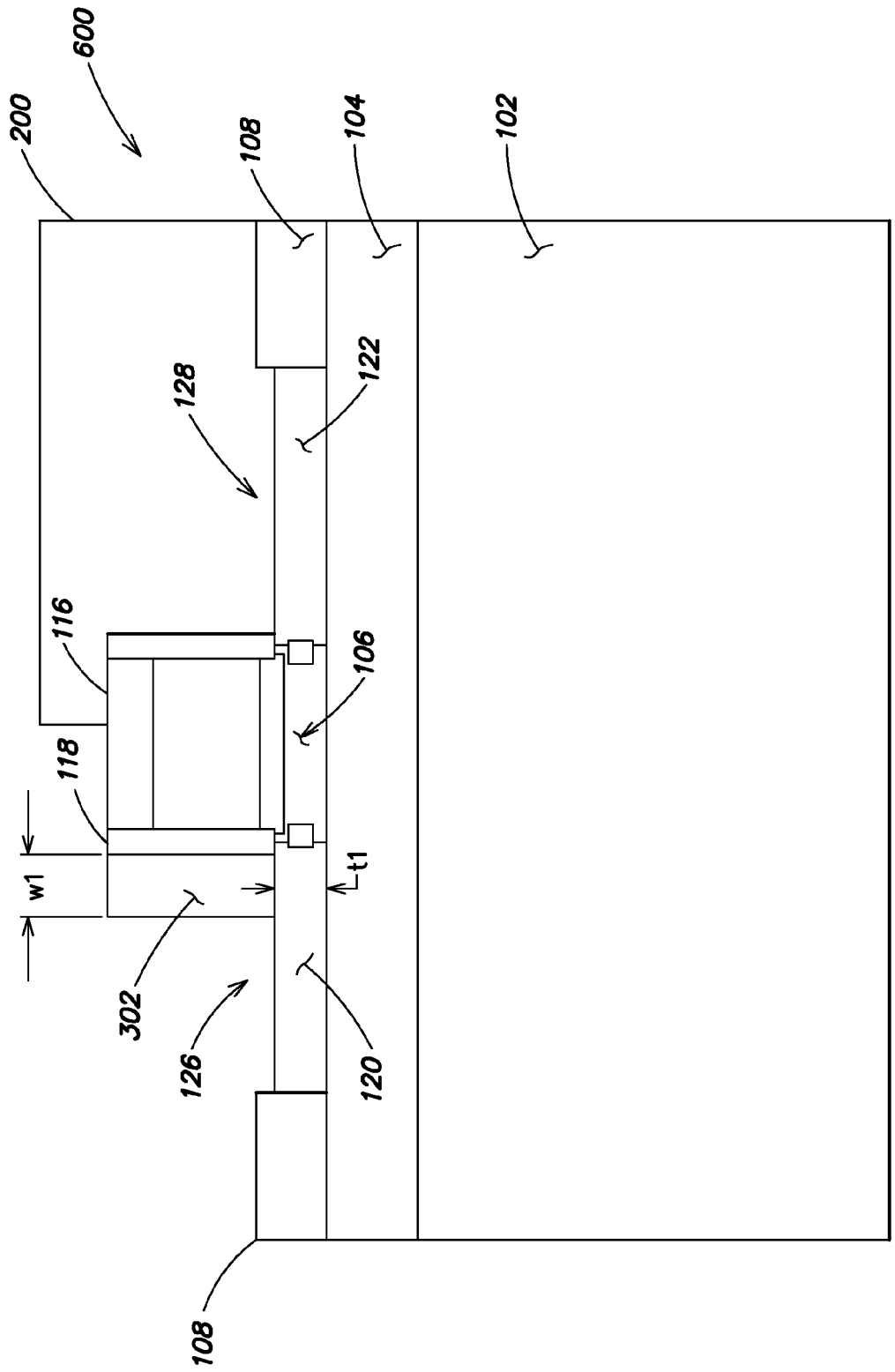
FIG. 6 is a cross-sectional side view of a substrate following a first step of a method of manufacturing the second exemplary high-voltage transistor in accordance with an embodiment of the present invention.

FIG. 6 is a cross-sectional side view of a substrate 600 following a first step of the method of manufacturing the second exemplary high-voltage transistor in accordance with an embodiment of the present invention. With reference to FIG. 6, CVD or another suitable method may be employed to form a conformal insulating layer (e.g., a nitride layer, oxide layer and/or the like) on the substrate 600. Thereafter, RIE or another suitable method may be employed to remove portions of the insulating layer. In this manner, a spacer 302 (e.g., a wide spacer) may be formed adjacent a sidewall of spacer 118 on a portion of the first region 120 in the high-voltage node 126. The spacer 302 may have a width w1 of about 10 nm to about 100 nm (although a larger or smaller and/or different spacer width range may be employed). In contrast to the method of manufacturing the first exemplary high-voltage transistor 412, during the method of manufacturing the second exemplary high-voltage transistor 800, the SOI layer 106 is not selectively thinned before forming the spacer 302. More specifically, the first region 120 is not thinned to thickness t2 but rather maintains thickness t1. In some embodiments, such process steps may also form the spacer 302 on other portions of the substrate 600, such as the STI oxide region 108 in the low-voltage node 128 (assuming such portion of the substrate 600 is exposed for processing). In this manner, a spacer width differential may be established between the high and low-voltage nodes 126, 128. More specifically, a combined width of spacer 118 and spacer 302 may prevent a larger portion of the first region 120 from being exposed during subsequent processing than the portion of the second region 122 protected by the spacer 118 in the low-voltage node 128.

Figure 7:
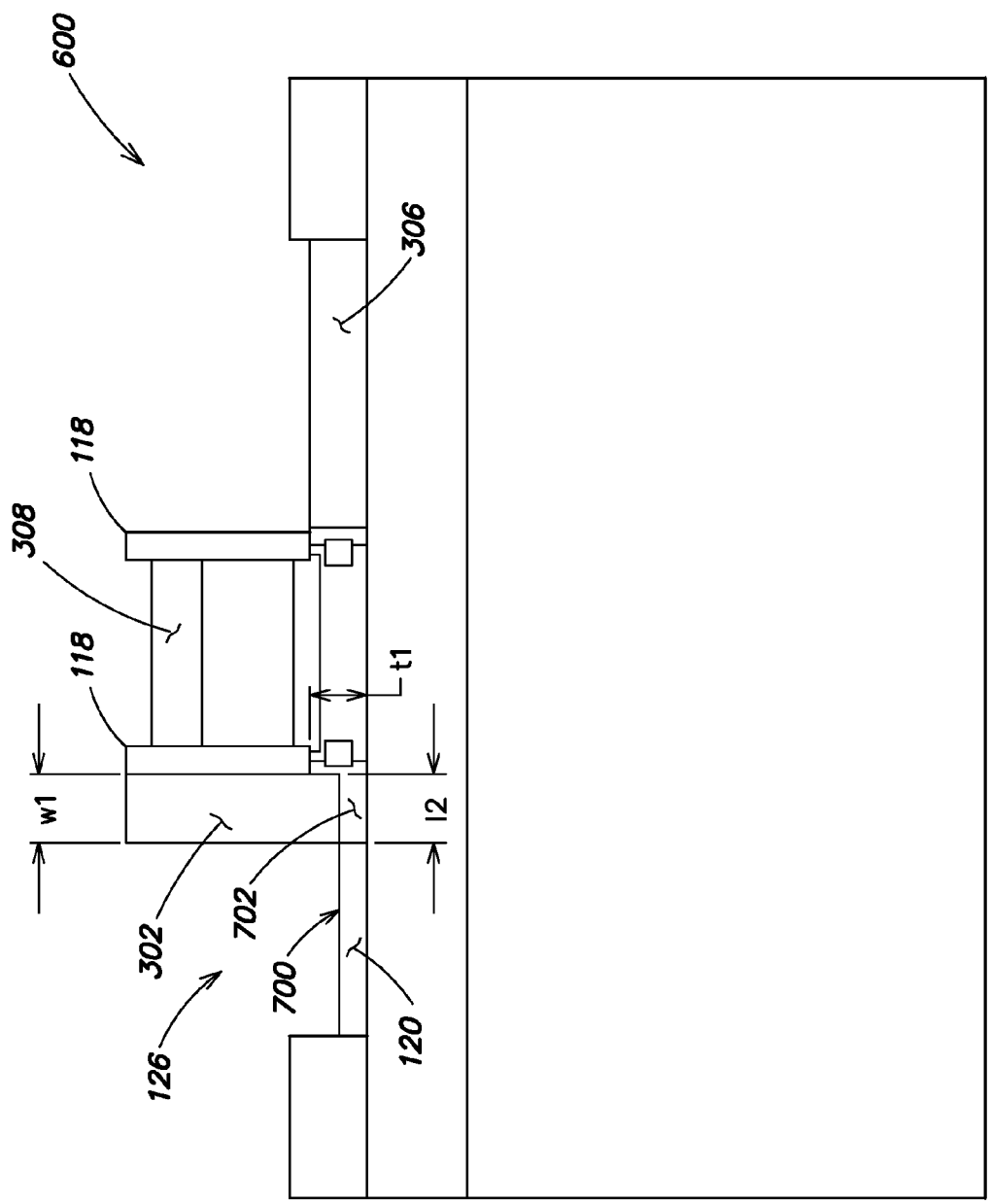
FIG. 7 is a cross-sectional side view of the substrate following a second step of the method of manufacturing the second exemplary high-voltage transistor in accordance with an embodiment of the present invention.

FIG. 7 is a cross-sectional side view of the substrate 600 following a second step of the method of manufacturing the second exemplary high-voltage transistor in accordance with an embodiment of the present invention. With reference to FIG. 7, steps to remove the mask 200 and gate-capping layer (116 in FIG. 6) from the substrate 600 and to implant the substrate 600 with dopant, are similar to corresponding steps described above with reference to FIG. 3. For example, RIE or another suitable method may be employed to remove the mask 200 from the substrate 600. Similarly, the gate-capping layer 116 may be removed from the substrate 600. High-dose implantation may be employed to form contact regions on exposed portions of the substrate 600. For example, a contact region 700 may be formed in the high-voltage node 126. Further, the contact regions 306, 308 may be formed. For example, a concentration of $1 \times 10^{19}$ cm$^{-3}$ to about $1 \times 10^{20}$ cm$^{-3}$ of n-type dopant (in the case of an NFET device) may be implanted into the substrate 600 to form low contact resistance regions 306, 308, 700. A portion 702 of the first region 120 protected from high-dose implantation by the spacers 302, 118 may be adapted to reduce a voltage therein, and therefore, may serve as an IR drop region. The length l2 of the IR drop region 702 may be based on the width w1 of the spacer 302 (along with a width of spacer 118). After high-dose implantation, the doping concentration of the IR drop region 702 compared to the contact region 700 is such that the resistance provided by the IR drop region 310 is greater than that provided by the contact region 700. Consequently, a voltage reduction provided by the IR drop region 702 may be based on a thickness t1, a length l2 and a doping concentration of such region 702, which affects the resistivity thereof. In this manner, the voltage reduction provided by the IR drop region 702 may be controlled laterally by the spacer 302 (e.g., a width w1 of the spacer 302).

Figure 8:
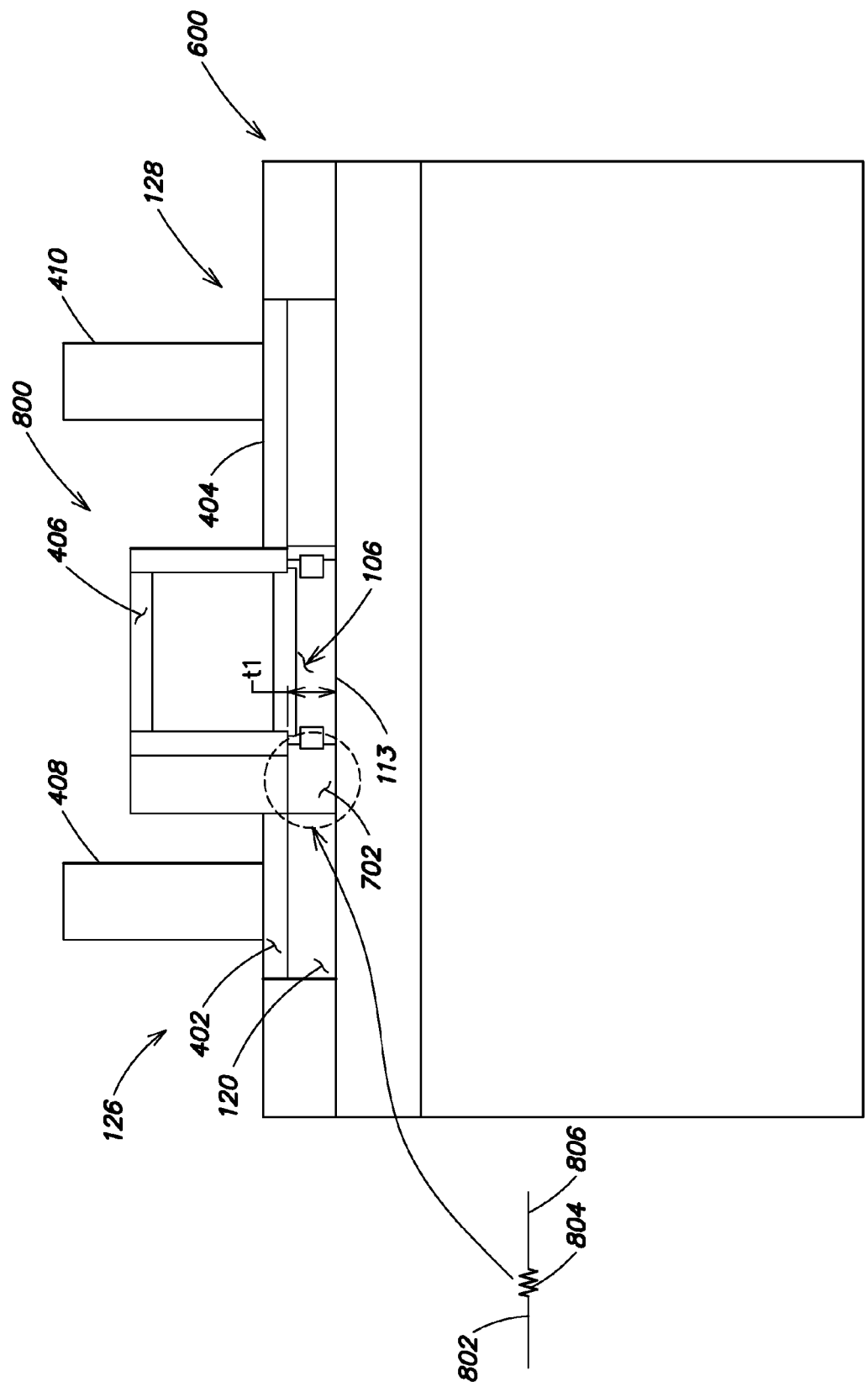
FIG. 8 is a cross-sectional side view of the substrate following a third step of the method of manufacturing the second exemplary high-voltage transistor in accordance with an embodiment of the present invention.

FIG. 8 is a cross-sectional side view of the substrate 600 following a third step of the method of manufacturing the second exemplary high-voltage transistor in accordance with an embodiment of the present invention. With reference to FIG. 8, steps to form silicide and interconnects 120 on the substrate 600 are similar to corresponding steps described above with reference to FIG. 4. For example, CMP or another suitable method may be employed to deposit a layer of metal on the substrate 600. Thereafter, silicidation may be employed to cause the metal to react with material coupled thereto (e.g., silicon, gate conductor and/or the like) such that silicide regions 402-406 are formed on the substrate 600. Thereafter, CVD or another suitable method followed by RIE or another suitable method may be employed to form interconnects on the substrate 600. For example, interconnects 408, 410 may be formed in the high and low-voltage nodes 126, 128, respectively. In this manner, a second exemplary high-voltage transistor (e.g., NMOS or PMOS) 800 may be manufactured. Similar to the first exemplary high-voltage transistor 412, in some embodiments, the transistor 800 may be an SOI n-channel laterally diffused MOSFET (S-NLD-MOS) (although the transistor 800 may have a different configuration). The high-voltage node 126 may serve as drain and the low-voltage node 128 may serve as a source of the transistor 800, or vice versa.

In operation, the high-voltage node 126 of the transistor 800 may detect or sense a high voltage and reduce such high voltage to a voltage typically employed by transistors for internal operation. A high voltage may be between about 5 V to about 50 V and a voltage typically employed by transistors for internal operation is about 1 V to about 3 V. More specifically, the IR drop region 702 may be adapted (e.g., via dimensions and doping thereof) to reduce the high voltage to a voltage suitable to internal operation of the transistor 800. For example, because the IR drop region 702 has a thickness t1, the transistor 800 may be employed to sense a high voltage of about 5 V to about 10 V. The low-voltage node 128 may be of a low resistance such that the low-voltage node 128 may provide little or no voltage drop.

Similar to the first exemplary high-voltage transistor 412, in the second exemplary high-voltage transistor 800, an interconnect 408 may function as a short circuit and the IR drop region 702 may function as a high resistance element. Therefore, the interconnect 408 coupled to the IR drop region 702 of the high-voltage node 126 may schematically be represented as a wire 802 coupled to a resistor 804 which are coupled to the channel 113 which may be represented as a wire 806.

Through use of the method described above with reference to FIGS. 6-8, a transistor 800 having one or more components formed in an SOI layer 106 of a substrate 600 may be formed. For example, the transistor 800 may include a high-voltage node 126 having a diffusion region 120 formed in the SOI layer 106. The diffusion region 120 includes an IR drop region 702 adapted to reduce therein a high voltage (e.g., greater than about 5 V, preferably between about 5 V and about 10 V) to a typical voltage for internal transistor operation (e.g., less than about 3 V). Further, the transistor 800 include a low-voltage node 128 adapted to provide little or no voltage drop therein.

Figure 9:
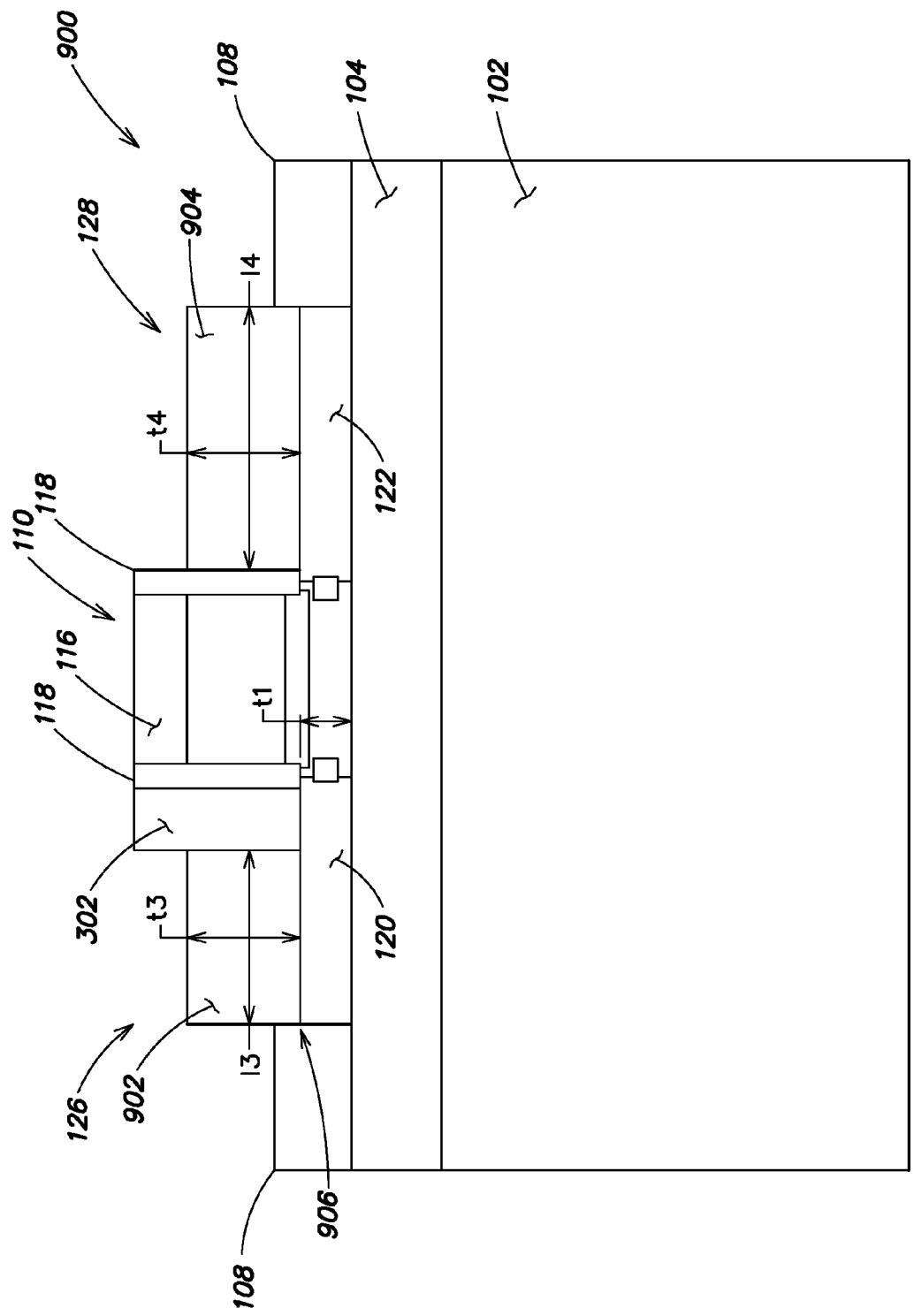
FIG. 9 is a cross-sectional side view of a substrate following a first step of a method of manufacturing a third exemplary high-voltage transistor in accordance with an embodiment of the present invention.

The present invention provides a third exemplary high-voltage transistor (1116 in FIG. 11) and method of manufacturing the same. The method of manufacturing the third exemplary high-voltage transistor may include steps of the method of manufacturing the second exemplary method through the step described with reference to FIG. 6. For convenience, when appropriate, reference numerals of components in the second exemplary high-voltage transistor 800 are employed for corresponding components in the third exemplary high-voltage transistor (1116 in FIG. 11). FIG. 9 is a cross-sectional side view of a substrate 900 following a first step of a method of manufacturing a third exemplary high-voltage transistor in accordance with an embodiment of the present invention. With reference to FIG. 9, RIE or another suitable method may be employed to remove the mask 200 from the substrate 900. However, the gate-capping layer 116 is not removed, thereby preventing shorting a diffusion region 120, 122 to the gate stack 110 during subsequent processing (e.g., silicon epitaxy).

Epitaxy or another suitable method may be employed to selectively grow regions of silicon on the substrate 900. For example, a first region 902 of epitaxial silicon may be formed on exposed portions of the first diffusion region 120 in the high-voltage node 126. The first region 902 of epitaxial silicon may have a thickness t3 of about 10 nm to about 100 nm and a length l3 of about 50 nm to about 500 nm (although a larger or smaller and/or different thickness and/or length may be employed). Similarly, a second region 904 of epitaxial silicon may be formed on exposed portions of the second diffusion region 122 in the low-voltage node 128. The second region 904 of epitaxial silicon may have a thickness t4 of about 10 nm to about 100 nm and a length l4 of about 50 nm to about 500 nm (although a larger or smaller and/or different thickness and/or length may be employed). In this manner, raised diffusion regions may be formed. The first region 902 and/or second region 904 of epitaxial silicon may have an n-type dopant concentration (in the case of an NFET device) of about $1 \times 10^{18}$ cm$^{-3}$ to about $1 \times 10^{20}$ cm$^{-3}$ (although a larger or smaller and/or different concentration range may be employed). In some embodiments, to achieve such concentrations, the first and/or second regions 902, 904 of epitaxial silicon may be in-situ doped (e.g., with a low dose of dopant). Alternatively, epitaxy may be followed by substrate implantation (e.g., of a low dose of dopant) to achieve such concentrations.

The first epitaxial silicon region 902 and the first diffusion region 120 in the high-voltage node 126 may be adapted to reduce a voltage therein, and therefore, may serve as an IR drop region 906. A voltage reduction provided by the first epitaxial silicon region 902 and/or the first diffusion region 120 may be based on respective dopant concentrations thereof. Further, the voltage reduction provided by the first epitaxial silicon region 902 and/or the first diffusion region 120 may be based on respective dimensions (e.g., lengths and widths) thereof. Therefore, the first epitaxial silicon region 902 and/or the first diffusion region 120 may provide an IR drop through vertical and horizontal paths. Further, the IR drop region 906 may be adapted to dissipate thermal energy (e.g., heat) caused by a high current through the node 126. Similar to the voltage reduction, thermal dissipation provided by the IR drop region 906 may be based on respective dimensions (e.g., lengths and widths) of the first epitaxial silicon region 902 and/or the first diffusion region 120.

Figure 10:
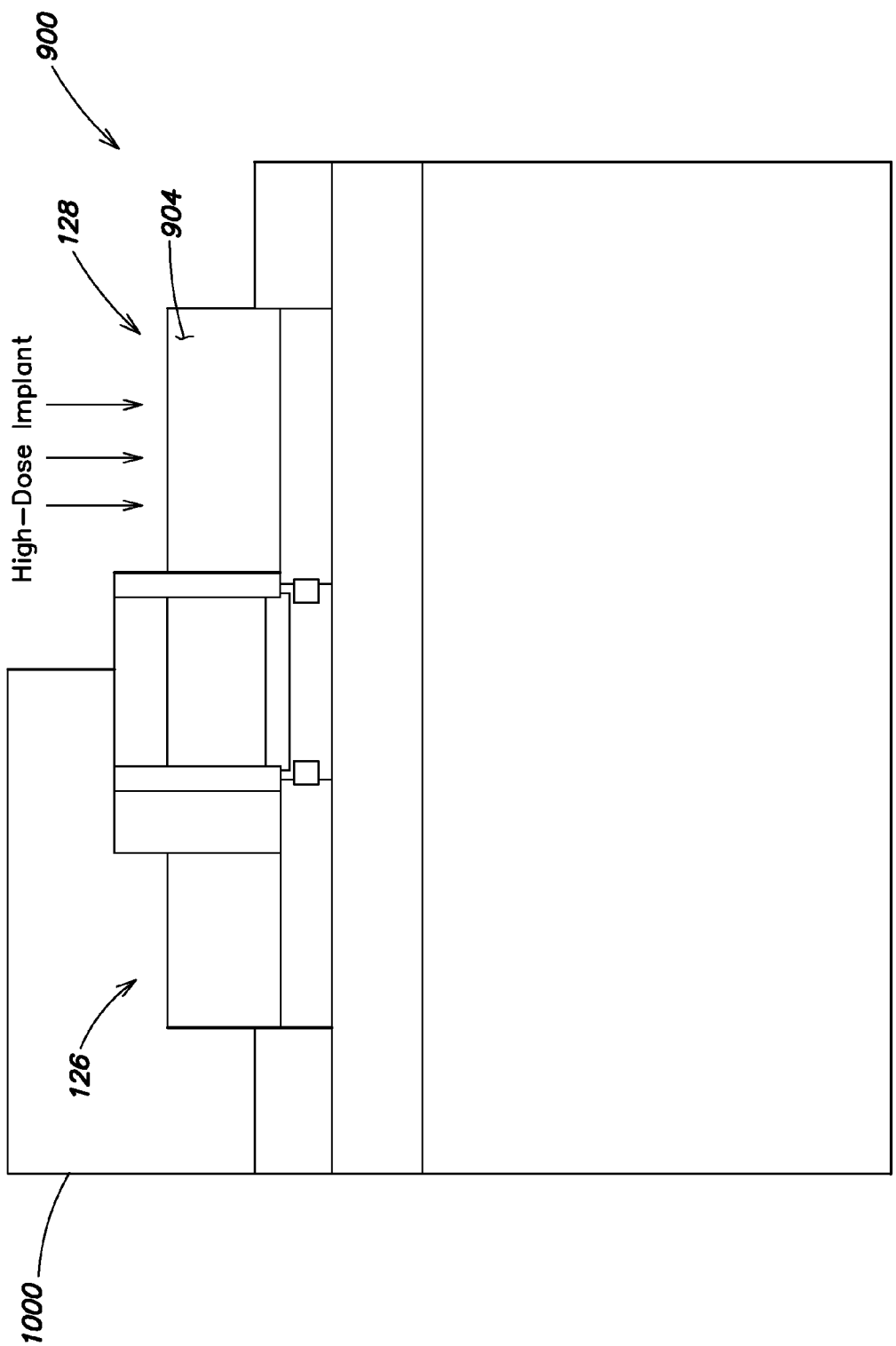
FIG. 10 is a cross-sectional side view of the substrate following a second step of the method of manufacturing the third exemplary high-voltage transistor in accordance with an embodiment of the present invention.

FIG. 10 is a block diagram of a cross-sectional side view of the substrate 900 following a second step of the method of manufacturing the third exemplary high-voltage transistor in accordance with an embodiment of the present invention. With reference to FIG. 10, a spin-on technique or another suitable method may be employed to deposit a photoresist layer on the substrate 900. The photoresist layer may be patterned with a mask such that portions of the photoresist layer may be removed during a subsequent process (e.g., developing). In this manner, the second mask 1000 may be formed on the high-voltage node 126 of the substrate 900. Alternatively, rather than the photoresist layer, a layer of hard mask material such as polysilicon, silicon nitride (SiN) or the like, may be deposited, and thereafter, selectively etched to yield the second mask 1000. Consequently, the low-voltage node 128 may remain exposed (e.g., not covered by the second mask 1000).

A high-dose implantation may be employed to dope the low-voltage node 128. For example, a concentration of $1 \times 10^{18}$ cm$^{-3}$ to about $1 \times 10^{21}$ cm$^{-3}$ of n-type dopant (in the case of an NFET device) may be implanted into the substrate 100 to dope the second epitaxial silicon region 904. However, a larger or smaller and/or different concentration range may be employed. Additionally or alternatively, a different type of and/or additional dopant may be employed. Such an implant may cause the low-voltage node 128 to have a low resistance. Therefore, the low-voltage node 128 may provide little or no voltage drop. Consequently, operation of the manufactured transistor on the low-voltage node 128 (and overall) may be improved.

Figure 11:
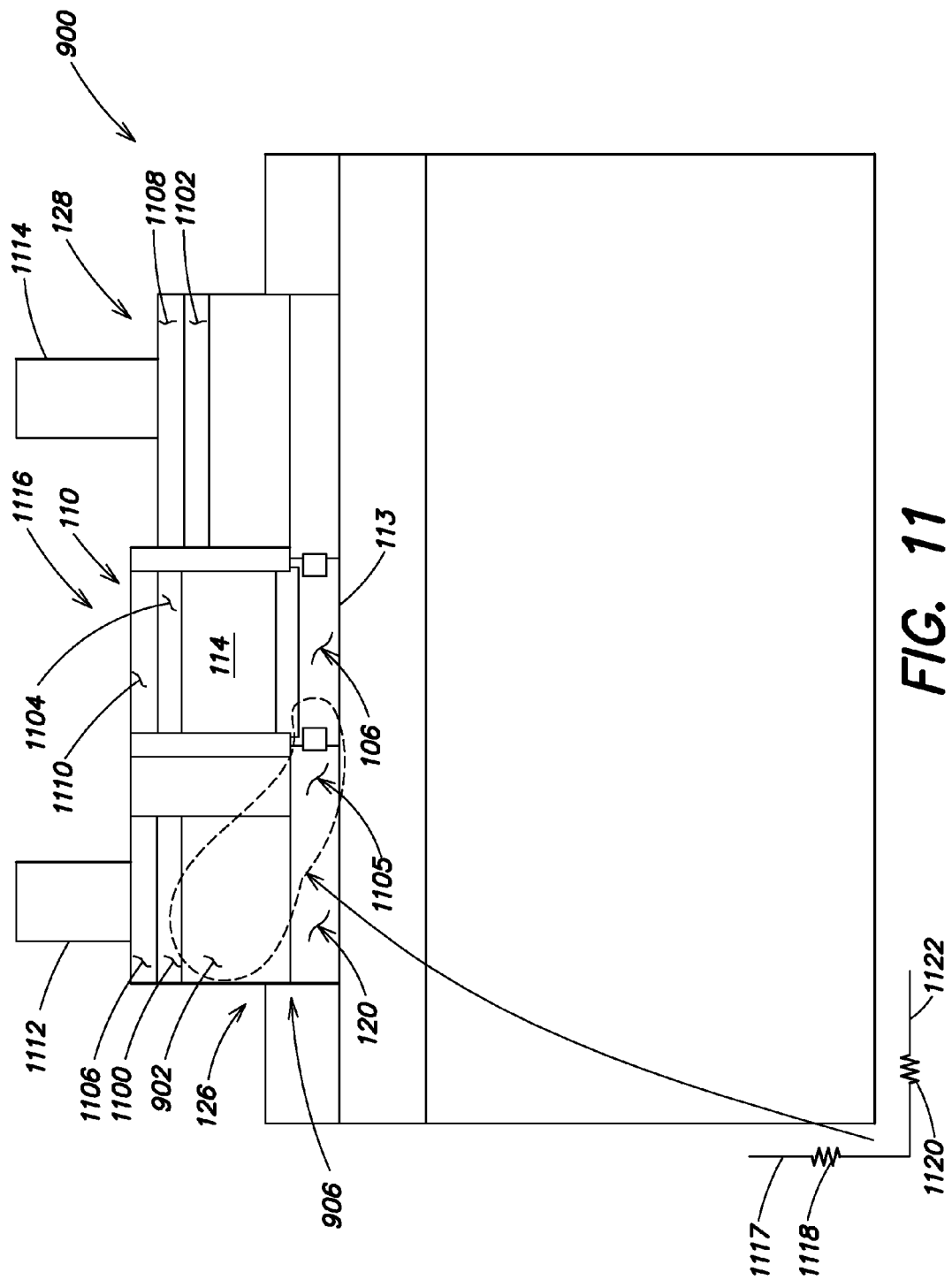
FIG. 11 is a cross-sectional side view of the substrate following a third step of the method of manufacturing the third exemplary high-voltage transistor in accordance with an embodiment of the present invention.

FIG. 11 is a cross-sectional side view of the substrate 900 following a third step of the method of manufacturing the third exemplary high-voltage transistor in accordance with an embodiment of the present invention. With reference to FIG. 11, RIE or another suitable method may be employed to remove the second mask (1000 in FIG. 10) from the substrate 900. Similarly, the gate-capping layer (116 in FIG. 9) may be removed from the substrate 900. Thereafter, high-dose implantation may be employed to form contact regions on exposed portions of the substrate 900. For example, contact regions 1100-1104 may be formed in the high-voltage node 126, low-voltage node 128 and on an exposed portion of the gate conductor 114, respectively. For example, a concentration of $1 \times 10^{-9}$ cm$^{-3}$ to about $1 \times 10^{20}$ cm$^{-3}$ of n-type dopant (in the case of an NFET device) may be implanted into the substrate 900 to form the low contact resistance regions 1100-1104. The spacer 302 may protect a portion 1105 of the first region 120 thereunder from being exposed to the implantation.

CMP or another suitable method may be employed to deposit a layer of metal on the substrate 900. Thereafter, silicidation may be employed to cause the metal to react with material coupled thereto (e.g., the gate contact regions 1100-1106) such that silicide regions 1106-1110 are formed on the substrate 900.

Thereafter, CVD or another suitable method followed by RIE or another suitable method may be employed to form interconnects on the substrate 900. For example, interconnects 1112, 1114 may be formed in the high and low-voltage nodes 126, 128, respectively. In this manner, a first exemplary high-voltage transistor (e.g., NMOS or PMOS) 1116 may be manufactured. In some embodiments, the transistor 1116 may be an SOI n-channel laterally diffused MOSFET (S-NLDMOS) (although the transistor 1116 may have a different configuration). The high-voltage node 126 may serve as drain and the low-voltage node 128 may serve as a source of the transistor 1116, or vice versa.

In operation, similar to the first and second transistors 412, 800, the high-voltage node 126 of the third exemplary transistor 1116 may detect or sense a high voltage and reduce such high voltage to a voltage typically employed by transistors for internal operation. A high voltage may be between about 5 V to about 50 V and a voltage typically employed by transistors for internal operation may be about 1 V to about 3 V. More specifically, the IR drop region 906 may be adapted (e.g., via dimensions and doping thereof) to reduce the high voltage to a voltage suitable to internal operation of the transistor 1116. Additionally, the IR drop region 906 may be adapted to dissipate thermal energy caused by a high current through such region 906. The low-voltage node 128 may be of a low resistance such that the low-voltage node 128 may provide little or no voltage drop.

In the third exemplary high-voltage transistor 1116, the interconnect 1112 may function as a short circuit, the first epitaxial silicon region 902 of the IR drop region 906 may function as a first high-resistance element and the first diffusion region 120 of the IR drop region 906 may function as a second high-resistance element. Therefore, the interconnect 1112 coupled to the IR drop region 906 of the high-voltage node 126 may schematically be represented as a wire 1117 coupled to a first resistor 1118 which is coupled to a second resistor 1120, all of which are coupled to the channel 113 which may be represented as a wire 1122.

Through use of the third exemplary method a transistor 1116 having one or more components formed in an SOI layer 106 of a substrate 900 may be formed. For example, the transistor 1116 may include a high-voltage node 126 having a diffusion region 120 formed in the SOI layer 106. The diffusion region 120 and a vertically-controlled first epitaxial silicon region 902 may form an IR drop region 906 adapted to reduce therein a high voltage (e.g., greater than about 5 V) to a typical voltage for internal transistor operation (e.g., less than about 3 V). Further, the transistor 1116 include a low-voltage node 128 adapted to provide little or no voltage drop therein. As stated the IR drop region 906 may also dissipate thermal energy caused by a high current in the region 906.

The foregoing description discloses only exemplary embodiments of the invention. Modifications of the above disclosed apparatus and methods which fall within the scope of the invention will be readily apparent to those of ordinary skill in the art. For instance, although IR drop regions 310, 702, 906 having specific configurations, specific dimensions and/or doping concentration are described above, in other embodiments, an IR drop region having a different configuration, dimensions and/or doping concentration may be employed. The high-voltage transistors 412, 800, 1116 of the present invention may be employed to interface with high-voltage applications in the automotive, commercial, military, space, medical and/or similar field. The high-voltage transistors 412, 800, 1116 may include 3-D devices having isolation between an active region.

Accordingly, while the present invention has been disclosed in connection with exemplary embodiments thereof, it should be understood that other embodiments may fall within the spirit and scope of the invention, as defined by the following claims.

The invention claimed is:

1. A high-voltage transistor, comprising:
a gate channel formed in a silicon-on-insulator (SOI) layer of a substrate, wherein the substrate includes a bulk silicon layer that is below an insulator layer that is below the SOI layer;
a first transistor node coupled to the gate channel; and
a second transistor node coupled to the gate channel; wherein:
the first transistor node includes a first diffusion region of the transistor, and a portion of the first transistor node is formed in the SOI layer;
a portion of the first transistor node includes a first epitaxial silicon layer formed on the first diffusion region, and the first diffusion region and the first epitaxial silicon layer have a combined first resistance sufficient to reduce a voltage greater than about 5 V within the transistor to a voltage less than about 3 V;
the second transistor node includes a second diffusion region of the transistor, and a portion of the second transistor node is formed in the SOI layer; and
a portion of the second transistor node includes a second epitaxial silicon layer formed on the second diffusion region, and the second diffusion region and the second epitaxial silicon layer have a combined second resistance lower than the first resistance such that a negligible voltage drop occurs across the second transistor node.

2. The high-voltage transistor of claim 1 further comprising an insulating spacer on a portion of the first diffusion region;
wherein a resistance of a portion of the first diffusion region covered by the spacer is higher than a resistance of a portion of the first diffusion region not covered by the spacer.

3. The high-voltage transistor of claim 2 wherein the insulating spacer is about 10 nm to about 100 nm wide.

4. The high-voltage transistor of claim 2 wherein a thickness of silicon in the first diffusion region is between about 10 nm and about 100 nm.

5. The high-voltage transistor of claim 1 further comprising:
an insulating spacer formed on a portion of the first diffusion region;
wherein the first diffusion region has a dopant concentration in the range of $1 \times 10^{15}$ cm$^{-3}$ to $1 \times 10^{17}$ cm$^{-3}$ and the first epitaxial silicon layer has a dopant concentration in the range of $1 \times 10^{18}$ cm$^{-3}$ to $1 \times 10^{20}$ cm$^{-3}$.

6. The high-voltage transistor of claim 5 wherein the insulating spacer is about 5 nm to about 200 nm wide.

7. The high-voltage transistor of claim 5 wherein the first epitaxial silicon layer is about 10 nm to about 100 nm thick.

8. The high-voltage transistor of claim 5 wherein a resistance of the first epitaxial layer is less than a resistance of the first diffusion region.

9. The high-voltage transistor of claim 1, wherein the first epitaxial silicon layer further has a dimension sufficient to reduce the voltage greater than about 5 V within the transistor to a voltage less than about 3 V.

10. A substrate, comprising:
a bulk silicon layer that is below an insulator layer that is below a silicon-on-insulator (SOI) layer; and
a high-voltage transistor, comprising:
a gate channel formed in the SOI layer of the substrate;
a first transistor node coupled to the gate channel; and
a second transistor node coupled to the gate channel; wherein:
the first transistor node includes a first diffusion region of the transistor, and a portion of the first transistor node is formed in the SOI layer;
a portion of the first transistor node includes a spacer formed on a portion of the first diffusion region, wherein the spacer covers a portion of the first diffusion region, the covered portion of the first diffusion region having a lower dopant concentration than an uncovered portion of the first diffusion region, wherein the covered portion has a dopant concentration sufficient to reduce a voltage greater than about 5 V within the transistor to a voltage less than about 3 V; and
the second transistor node includes a second diffusion region of the transistor, and a portion of the second transistor node is formed in the SOI layer, the covered portion of the first diffusion region having a lower dopant concentration than the second diffusion region.

11. The substrate of claim 10 wherein the resistance of the covered portion of the first diffusion region is higher than a resistance of the uncovered portion of the first diffusion region, and the resistance of the covered portion is sufficient to reduce the voltage greater than about 5 V within the transistor to a voltage less than about 3 V.

12. The substrate of claim 10, wherein the covered portion of the first diffusion region further has a dimension sufficient to reduce the voltage greater than about 5 V within the transistor to a voltage less than about 3 V.

13. The substrate of claim 10, wherein the spacer has a width of about 80 nm to about 200 nm.

14. The substrate of claim 10, wherein the dopant concentration of the covered portion is about $1\times10^{15}$ cm$^{-3}$ to about $1\times10^{17}$ cm$^{-3}$.

* * * * *